(12) United States Patent
Orlogi et al.

(10) Patent No.: US 7,066,039 B1
(45) Date of Patent: Jun. 27, 2006

(54) METHOD AND DEVICE FOR CHECKING THE MECHANICAL FASTENING OF A COMPONENT TO A BASE BODY

(75) Inventors: Helmuth Orlogi, Regensburg (DE); Marten Swart, Obertraubling (DE)

(73) Assignee: Siemens Atkiengesellschaft, Munich (DE)

( * ) Notice: Subject to any disclaimer, the term of this patent is extended or adjusted under 35 U.S.C. 154(b) by 0 days.

(21) Appl. No.: 10/311,058

(22) PCT Filed: Jun. 16, 2000

(86) PCT No.: PCT/DE00/02004

§ 371 (c)(1),
(2), (4) Date: Sep. 11, 2003

(87) PCT Pub. No.: WO01/96886

PCT Pub. Date: Dec. 20, 2001

(51) Int. Cl.
*G01N 19/00* (2006.01)
(52) U.S. Cl. .................. 73/865.9; 340/568.2; 324/691; 73/866.5
(58) Field of Classification Search .... 73/865.8–865.9, 73/866.5; 340/568.1, 568.2, 568.3, 568.4, 340/687; 324/691
See application file for complete search history.

(56) References Cited

U.S. PATENT DOCUMENTS

| | | | | |
|---|---|---|---|---|
| 2,658,120 A | * | 11/1953 | Murphy | 200/83 C |
| 3,803,577 A | * | 4/1974 | Peterson, II | 340/568.4 |
| 4,178,627 A | * | 12/1979 | Baumann | 362/240 |
| 4,646,203 A | * | 2/1987 | Ngo et al. | 361/708 |
| 5,950,973 A | * | 9/1999 | Verma | 248/222.51 |
| 6,361,384 B1 | * | 3/2002 | Manor et al. | 439/883 |
| 2001/0022552 A1 | * | 9/2001 | Maloney | 340/568.1 |
| 2004/0150523 A1 | * | 8/2004 | Kelsch et al. | 340/568.1 |

FOREIGN PATENT DOCUMENTS

JP    A 9-159558    6/1997
JP    10035408 A  *  2/1998

\* cited by examiner

*Primary Examiner*—Hezron Williams
*Assistant Examiner*—Nashmiya Fayyaz
(74) *Attorney, Agent, or Firm*—Morrison & Foerster LLP

(57) ABSTRACT

The invention relates to a method for inspecting the mechanical fastening of a component including an electrical conductor to a base body including an electric conductor. According to the method, the electric conductors for mechanically connecting the component to the base body such that an electric connection between the component and the base body is formed when a rigid mechanical connection is established, such that the resistance between the conductors is measured and a resistance value which lies below a predetermined value attests the existence of a rigid mechanical connection.

3 Claims, 1 Drawing Sheet

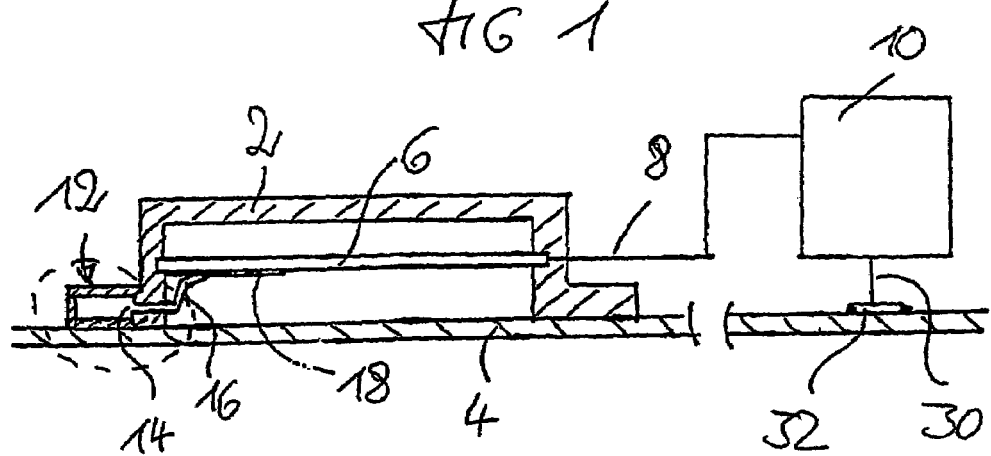
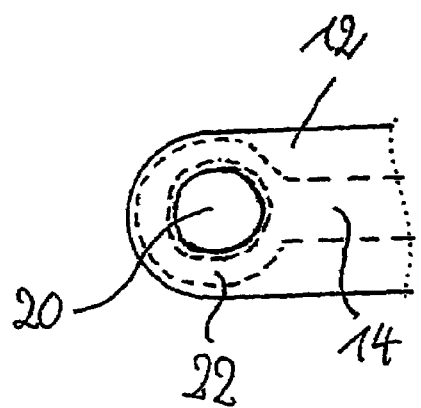
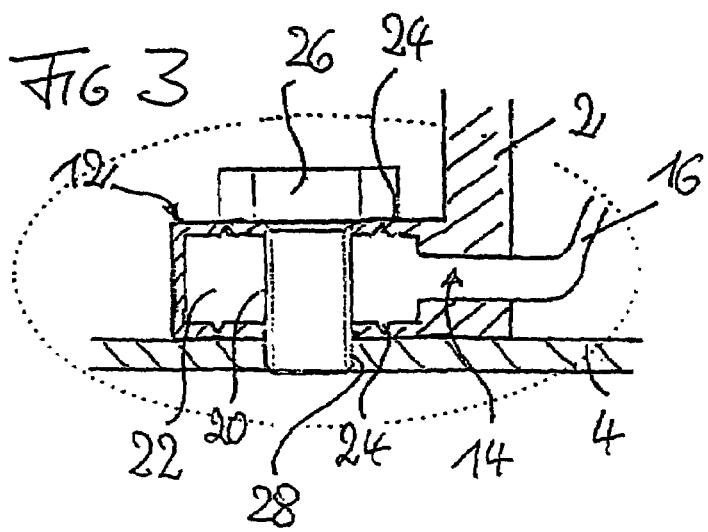

METHOD AND DEVICE FOR CHECKING THE MECHANICAL FASTENING OF A COMPONENT TO A BASE BODY

CLAIM FOR PRIORITY

This application claims priority to International Application No. PCT/DE00/02004 which was published in the German language on Dec. 20, 2001.

TECHNICAL FIELD OF THE INVENTION

The invention relates to a method and a device for checking the mechanical attachment of a component including an electrical conductor to a base body including an electrical conductor.

BACKGROUND OF THE INVENTION

In practice, the operational capability of devices is frequently conditional on their satisfactory attachment to a base body. For example, an airbag controller must be satisfactorily attached to the bodywork of a vehicle, or the vehicle body, if the airbag controller contains an acceleration sensor, where the sensor senses accelerations which act on the bodywork of a vehicle when a collision occurs. If the attachment is not satisfactory, an accident may not be satisfactorily detected so that the airbag is not properly triggered. There is also the risk of the airbag being inadvertently triggered if the controller is not carefully handled.

SUMMARY OF THE INVENTION

In one embodiment of the invention, an electrical connection is produced between the component to be attached and the base body when satisfactory attachment has occurred. It is easy to check for the existence of the electrical connection, and to detect the satisfactory attachment and to set specific functions in operation or activate warning indications as a function of the result of the check.

The invention can be used advantageously wherever the operational capability of a system is conditional on satisfactory attachment of a component associated with the system to a base body. This may apply to housings with electrical circuits which have an acceleration sensor for sensing accelerations of the base body, or devices which have a temperature sensor for sensing the temperature of the base body, or devices which must bear in a satisfactory fashion against a base body in order to cool components which are included in them, and so on.

BRIEF DESCRIPTION OF THE DRAWINGS

The invention is explained below with reference to drawings using an example in which the component to be attached is the housing of an airbag controller, and the base body is the sheet metal panel of the bodywork of a vehicle.

In the drawings:
FIG. 1 shows a controller attached to a sheet metal panel.
FIG. 2 is a plan view of an attachment eyelet.
FIG. 3 is a cross section through an attachment eyelet.

DETAILED DESCRIPTION OF THE INVENTION

According to FIG. 1, a housing 2 of an airbag controller is attached to a sheet metal panel 4 of the bodywork of a vehicle. The housing 2 includes a printed circuit board 6 which includes, in a manner known to the skilled artisan, an acceleration sensor (not illustrated) and an evaluation circuit. The printed circuit board 6 is connected via a line 8, preferably a multi-conductor line, via which power is supplied and signals are evaluated, to a controller 10, the controller 10 controlling, for example, the electronics of the bodywork of the vehicle and having a microprocessor with associated storage devices. The design and function of the vehicle-occupant protection systems which include an airbag and/or further safety devices such as seatbelt pretensioners etc. and their control, if appropriate via a bus system, are known to the skilled artisan and are therefore not explained.

The satisfactory function of the vehicle-occupant protection system and the satisfactory integration of the airbag are conditional on the housing 2 having a rigid mechanical connection to the sheet metal panel 4. Otherwise, accelerations cannot be transmitted from the sheet metal panel 4 to the printed circuit board 6 which is fitted with one or more acceleration sensors. Furthermore, when the housing 2 is not satisfactorily attached to the sheet metal panel 4, there is the possibility that, due to external manipulation, the housing 2 experiences vibrations which lead to the airbag being triggered.

The housing which is made of plastic or some other electrically non-conductive material has attachment eyelets 12 for its attachment. FIG. 2 shows a plan view of such an attachment eyelet 12, and FIG. 3 shows the detail marked by broken lines in FIG. 1, on an enlarged scale.

As illustrated, a contact element 14 which is composed of metal is cast into the attachment eyelet 12 which is constructed in one piece with the housing 2 or a housing part, this contact element being surrounded, with the exception of the direction of the inside of the housing 2, by the non-conductive housing material. Toward the inside, the contact element 14 ends in a contact lug 16 which, when the printed circuit board 6 is fastened to the housing 2, comes into secure mechanical abutment against a conductor track 18 of the printed circuit board 6 so that electrical connection is made between the contact lug 16 and the conductor track 18. The housing 2 may, for example, be constructed in two pieces, the printed circuit board 6 being clamped in between an upper part of the housing and a lower part and being firmly accommodated in the housing, and at the same time coming to bear against the contact lug 16, when the upper part is connected to the lower part. The contact lug 16 can additionally be soldered to the conductor track 18.

The contact element 16 is formed such that it surrounds a hole 20 of the attachment eyelet 12 and forms an annular disk 22 which is held in the attachment eyelet 12. In each case between the upper side of the annular disk and the lower side of the annular disk there is still a predetermined material thickness of the material of the attachment eyelet 12 which is perfectly formed from plastic.

Contact-cutting parts 24 which protrude into the electrically non-conductive material of the attachment eyelet 12 are constructed on the upper side and the underside of the annular disk 22. In order to attach the housing 2 to the sheet metal panel 4, screws 26 which are made of metal are used, the screws 26 being screwed through the hole 20 into a threaded hole 28 in the sheet metal panel 4.

The controller 10 is connected in an electrically conductive fashion to the sheet metal panel 4 via a line 30, the line 30 being, for example, soldered to the sheet metal panel 4 at 32.

The arrangement described operates as follows:

If the housing 2 is attached to the sheet metal panel 4 by screwing in the screws 26, the contact-cutting parts 24 which are constructed in one part with the annular disk 22 of the contact element 14 pierce the electrically non-conductive material of the attachment eyelet 12 when the screws 26 are tightened, the contact-cutting parts 24 bearing in an electrically conductive fashion against the head of the screw 26 and the sheet metal panel 4. In this way, a secure electrical connection is produced between the conductor track 18 and the sheet metal panel 4 when the screw or screws 26 is/are tightened.

The controller 10, which is electrically conductively connected to the sheet metal panel 4 via the line 30, includes a testing circuit (not illustrated) which can be used to detect whether there is an electrical connection whose electrical resistance is below a predetermined threshold value between the conductor 18 and the sheet metal panel 4. This testing circuit takes the form, for example, of a predetermined electrical voltage being applied between the line 18 and the line 30, and the resulting flow of current being measured. Of course, the sheet metal panel 4 can form the ground of the system.

The testing circuit is integrated into the composite circuit for controlling a vehicle-occupant protection system in such a way that when there is no mechanical attachment of the housing 2 to the sheet metal panel 4, and thus no electrical connection between the conductor track 18 and the sheet metal panel 4 or the conductor 30, a warning signal is generated which indicates the absence of an attachment and deactivates the vehicle-occupant protection system. The warning signal does not cease, and the operation of the vehicle-occupant protection system is not enabled, until the testing circuit indicates a satisfactory electrical connection.

Of course, the arrangement described can be modified in various ways. For example, the contact-cutting parts 24 can be provided merely on the underside of the head of the screw 26. Furthermore, the screw 26 and the contact element 14 may be constructed such that when the screw screws through the contact element it comes into electrical contact with the contact element. To this end, the contact element 14 may, for example, be embodied as a thin piece of sheet metal in the region of the attachment eyelet 12, and the screw may be provided with a self-tapping thread so that the screw screws into the sheet metal panel 4 through the attachment eyelet 12 and the contact element 14 provided in it, even when there is no hole 20. The sheet metal panel 4 does not necessarily need to produce the connection between the contact element 14 and the line 30 of the controller 10. Instead, a separate conductor may be provided which comes into contact with the contact element 14 at the location of the sheet metal panel 4 when the housing 2 is attached to the sheet metal panel 4. This may be brought about, for example, by virtue of the fact that a contact lug which is electrically insulated with respect to the sheet metal panel 4 by the intermediate arrangement of an insulating element is positioned between the attachment eyelet 12 and the sheet metal panel 4, the contact lug coming into electrical contact with the lower contact-cutting parts 24 (FIG. 3) when the screw 26 is tightened, and said contact lug being directly connected to the controller 10 via a line. Similarly, the contact element does not necessarily need to be integrated into the attachment eyelet or into some other attachment region of the housing but rather can be led out of the housing separately and arranged, for example, between the insulating elements.

The housing could then even be composed of electrically conductive material. Instead of an attachment screw, other attachment devices, for example, clamping elements etc., may be provided. The testing circuit included, for example, in the controller 10 for checking the electrical connection between the conductor 18 and the sheet metal panel 4 which directly forms a conductor, or a further conductor, may have very different designs, the resistance being measured directly or indirectly. The printed circuit board 2 can also be equipped with evaluation modules and/or control modules in very different ways.

What is claimed is:

1. A testing device, comprising:
   a component including an electrical conductor, where the component is composed at least partially of an electrically non-conductive material and includes an attachment eyelet which is composed of electrically non-conductive material;
   a contact element which is embedded in the non-conductive material of the attachment eyelet and which contact element includes electrically conductive contact cutting parts embedded in the electrically non-conductive material of the attachment eyelet, wherein the contact element forms an annular disk around a hole and a material of a predetermined thickness formed of plastic is present surrounding the contact element;
   a base body containing an electrical conductor;
   a mechanical attachment device containing a screw which can be screwed into the base body through the attachment eyelet, and an electrical connection between the respective conductors is made through the screw when the screw is tightened through the electrically conductive contact cutting parts; and
   a testing circuit for testing the electrical connection.

2. A testing device, comprising:
   a component including an electrical conductor, where the component is composed at least partially of an electrically non-conductive material and includes an attachment eyelet which is composed of electrically non-conductive material;
   a contact element which is embedded in the non-conductive material of the attachment eyelet and which contact element includes electrically conductive contact cutting parts embedded in the electrically non-conductive material of the attachment eyelet, wherein the contact element forms an annular disk around a hole and a material of a predetermined thickness formed of plastic is present surrounding the contact element;
   a base body containing an electrical conductor;
   a mechanical attachment device containing a screw which can be screwed into the base body through the attachment eyelet, and an electrical connection between the respective conductors is made through the screw when the screw is tightened through the electrically conductive contact cutting parts, wherein,
   the screw is composed of electrically conductive material, and the electrical connection between the conductors being made through the screw, and
   a head of the screw is embodied with at least one contact-cutting part which penetrates the non-conductive material of the component when the screw is tightened; and
   a testing circuit for testing the electrical connection.

3. A testing device, comprising:
   a component including an electrical conductor, where the component is composed at least partially of an electrically non-conductive material and includes an attachment eyelet which is composed of electrically non-conductive material;

a contact element which is embedded in the non-conductive material of the attachment eyelet and which contact element includes electrically conductive contact cutting parts embedded in the electrically non-conductive material of the attachment eyelet, wherein the contact element forms an annular disk around a hole and a material of a predetermined thickness formed of plastic is present surrounding the contact element;

a base body containing an electrical conductor;

a mechanical attachment device containing a screw which can be screwed into the base body through the attachment eyelet, and an electrical connection between the respective conductors is made through the screw when the screw is tightened through the electrically conductive contact cutting parts, wherein the screw is a self-tapping screw; and a testing circuit for testing the electrical connection.

* * * * *